United States Patent
Ikakura et al.

(10) Patent No.: US 10,008,528 B2
(45) Date of Patent: Jun. 26, 2018

(54) SOLID-STATE IMAGE SENSOR, METHOD OF MANUFACTURING THE SAME, AND CAMERA

(71) Applicant: CANON KABUSHIKI KAISHA, Tokyo (JP)

(72) Inventors: Hiroshi Ikakura, Kawasaki (JP); Nobutaka Ukigaya, Yokohama (JP); Jun Iba, Yokohama (JP); Taro Kato, Tokyo (JP); Takehito Okabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days. days.

(21) Appl. No.: 15/272,738

(22) Filed: Sep. 22, 2016

(65) Prior Publication Data

US 2017/0092677 A1    Mar. 30, 2017

(30) Foreign Application Priority Data

Sep. 30, 2015 (JP) .................................. 2015-194397

(51) Int. Cl.
*H01L 31/0232* (2014.01)
*H01L 27/146* (2006.01)

(52) U.S. Cl.
CPC .. *H01L 27/14625* (2013.01); *H01L 27/14605* (2013.01); *H01L 27/14607* (2013.01); *H01L 27/14609* (2013.01); *H01L 27/14643* (2013.01); *H01L 27/14685* (2013.01)

(58) Field of Classification Search
CPC ......... H01L 27/14625; H01L 27/14605; H01L 27/14607; H01L 27/14685; H01L 27/14609; H01L 27/14643
See application file for complete search history.

(56) References Cited

U.S. PATENT DOCUMENTS

| | | | |
|---|---|---|---|
| 7,683,407 B2 * | 3/2010 | Boettiger | .......... H01L 27/14625 257/292 |
| 7,993,951 B2 | 8/2011 | Okabe et al. | |
| 8,293,559 B2 | 10/2012 | Okabe et al. | |
| 8,390,726 B2 | 3/2013 | Tayanaka et al. | |

(Continued)

FOREIGN PATENT DOCUMENTS

| | | |
|---|---|---|
| JP | 2006-156799 A | 6/2006 |
| JP | 2008-177221 A | 7/2008 |

(Continued)

*Primary Examiner* — Stephen W Smooth
*Assistant Examiner* — Vicki B Booker
(74) *Attorney, Agent, or Firm* — Fitzpatrick, Cella, Harper & Scinto (57) ABSTRACT

A solid-state image sensor includes a substrate including a photoelectric conversion portion, an insulating layer having an opening, and a member arranged inside the opening. Letting d be a depth of the opening, the opening has, at an upper end of the opening, a shape having a width in a first direction parallel to the surface of the substrate, and a width in a second direction parallel to the surface of the substrate and orthogonal to the first direction. The widths in the first and second directions are different from each other. The shape is capable of drawing, at each point on a circumference of the opening at the upper end, a circle of 0.6d in diameter which contacts the circumference at the point and does not include a portion outside the opening.

20 Claims, 10 Drawing Sheets

(56) References Cited

U.S. PATENT DOCUMENTS

| | | |
|---|---|---|
| 8,514,309 B2 | 8/2013 | Kato et al. |
| 8,558,338 B2 | 10/2013 | Tsuji |
| 8,670,051 B2 | 3/2014 | Kato |
| 8,773,558 B2 | 7/2014 | Kato et al. |
| 8,817,164 B2 | 8/2014 | Tayanaka et al. |
| 8,885,082 B2 | 11/2014 | Nada et al. |
| 9,093,345 B2 | 7/2015 | Kato et al. |
| 9,140,603 B2 | 9/2015 | Kato et al. |
| 9,160,942 B2 | 10/2015 | Numata |
| 9,224,777 B2 | 12/2015 | Sawayama et al. |
| 9,261,769 B2 | 2/2016 | Yashiro et al. |
| 9,319,607 B2 | 4/2016 | Numata |
| 9,402,041 B2 | 7/2016 | Numata |
| 2009/0250777 A1 | 10/2009 | Takamiya |
| 2010/0245648 A1 | 9/2010 | Tayanaka et al. |
| 2011/0006387 A1 | 1/2011 | Katsuno et al. |
| 2012/0200727 A1 | 8/2012 | Kato et al. |
| 2012/0200751 A1* | 8/2012 | Kato ................. H01L 27/14627 348/294 |
| 2012/0202310 A1 | 8/2012 | Sawayama et al. |
| 2012/0267744 A1 | 10/2012 | Tsuji |
| 2013/0234220 A1 | 9/2013 | Tayanaka et al. |
| 2013/0309802 A1* | 11/2013 | Horikoshi ......... H01L 27/14625 438/69 |
| 2014/0035086 A1 | 2/2014 | Kato |
| 2014/0118589 A1* | 5/2014 | Numata ................... G02B 7/28 348/302 |
| 2014/0145287 A1 | 5/2014 | Kato |
| 2014/0246569 A1 | 9/2014 | Kato et al. |
| 2014/0333796 A1* | 11/2014 | Nishiwaki ............ H04N 5/2254 348/222.1 |
| 2015/0015752 A1 | 1/2015 | Numata |
| 2015/0015755 A1 | 1/2015 | Numata |
| 2015/0349015 A1 | 12/2015 | Yamaguchi |
| 2015/0358565 A1 | 12/2015 | Numata |
| 2016/0014362 A1* | 1/2016 | Kurokawa ........ H01L 27/14609 348/297 |
| 2016/0071896 A1 | 3/2016 | Kawabata et al. |
| 2016/0218127 A1 | 7/2016 | Kato et al. |
| 2016/0227139 A1* | 8/2016 | Shimotsusa ....... H01L 27/14625 |
| 2016/0247846 A1 | 8/2016 | Iida et al. |
| 2016/0343758 A1* | 11/2016 | Tomita ................. G02B 6/4295 |

FOREIGN PATENT DOCUMENTS

| | | |
|---|---|---|
| JP | 2009-158800 A | 7/2009 |
| JP | 2009-252983 A | 10/2009 |
| JP | 2010-239074 A | 10/2010 |
| JP | 2011-023409 A | 2/2011 |
| JP | 2011-079889 A | 4/2011 |
| JP | 2012-114159 A | 6/2012 |
| JP | 2012-182431 A | 9/2012 |
| JP | 2012-182435 A | 9/2012 |
| JP | 2012-227474 A | 11/2012 |
| JP | 2013-165297 A | 8/2013 |
| JP | 2015-073072 A | 4/2015 |
| JP | 2015-225939 A | 12/2015 |

* cited by examiner

COMPARATIVE EXAMPLE

FIG. 7B

COMPARATIVE EXAMPLE

FIG. 7C

COMPARATIVE EXAMPLE

SOLID-STATE IMAGE SENSOR, METHOD OF MANUFACTURING THE SAME, AND CAMERA

BACKGROUND OF THE INVENTION

Field of the Invention

The present invention relates to a solid-state image sensor, a method of manufacturing the same, and a camera.

Description of the Related Art

A solid-state image sensor of Japanese Patent Laid-Open No. 2009-158800 includes a light waveguide, which guides light to a photoelectric conversion portion, in an insulating layer on a substrate including the photoelectric conversion portion. The light waveguide is formed by forming an opening in the insulating layer on the substrate and embedding, in this opening, a material having a refractive index higher than that of the insulating layer (to be referred to as a high refractive index material hereinafter). In this solid-state image sensor, one pixel includes two photoelectric conversion portions, and focus detection is performed by using a signal obtained from each of these portions.

SUMMARY OF THE INVENTION

The upper surface of a light waveguide of a solid-state image sensor described in Japanese Patent Laid-Open No. 2009-158800 has a circular shape. It is considered, however, that the upper surface of the light waveguide is made to have a shape other than a circle in order to efficiently perform light condensation to respective photoelectric conversion portions in one pixel. It is also considered that for a pixel including only one photoelectric conversion portion, the upper surface of the light waveguide is made to have a shape other than a circle so as to correspond to the shape of the photoelectric conversion portion. The present inventors have found that a void may be formed when a material is embedded in an opening in order to form such a light waveguide. If the void exists in the light waveguide, the amount of light reaching the photoelectric conversion portion is decreased due to a reflection effect of incident light by the void. An aspect of the present invention provides the shape of the light waveguide capable of reducing formation of the void.

According to some embodiments, a solid-state image sensor includes a substrate including a photoelectric conversion portion, an insulating layer on a surface of the substrate and having an opening positioned above the photoelectric conversion portion, and a member arranged inside the opening. Letting d be a depth of the opening, the opening has, at an upper end of the opening, a shape having a width in a first direction parallel to the surface of the substrate, and a width in a second direction parallel to the surface of the substrate and orthogonal to the first direction, the widths in the first and second directions being different from each other, wherein the shape is capable of drawing, at each point on a circumference of the opening at the upper end, a circle of 0.6d in diameter which contacts the circumference at the point and does not include a portion outside the opening.

Further features of the present invention will become apparent from the following description of exemplary embodiments (with reference to the attached drawings).

DESCRIPTION OF THE EMBODIMENTS

Embodiments of the present invention will be described below with reference to the accompanying drawings. The same reference numerals denote the same elements throughout various embodiments, and a repetitive description thereof will be omitted. The embodiments can appropriately be modified or combined.

Figure 1A:
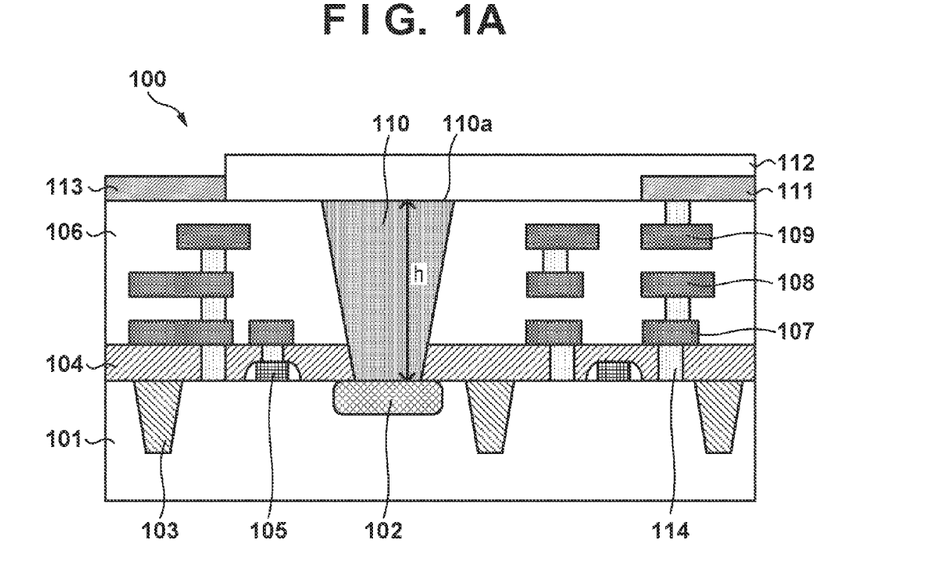
FIGS. 1A and 1B are views for explaining the structure of a solid-state image sensor according to an embodiment.
Figure 1B:
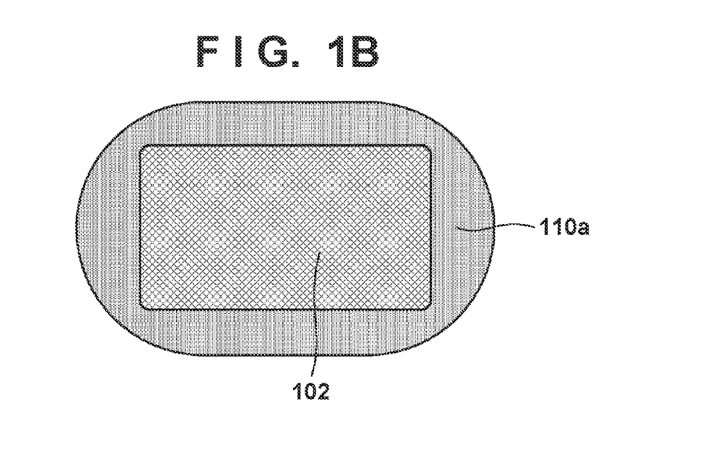

The structure of a solid-state image sensor 100 according to some embodiments of the present invention will be described with reference to FIGS. 1A and 1B. The solid-state image sensor 100 includes a plurality of pixels arranged in a two-dimensional array. FIG. 1A is a sectional view showing the solid-state image sensor 100 in which attention is paid to one pixel. FIG. 1B is a plan view showing the solid-state image sensor 100 in which attention is paid to a photoelectric conversion portion 102 and an upper surface 110a of a light waveguide 110.

The solid-state image sensor 100 includes a semiconductor substrate 101 such as a silicon substrate. The semiconductor substrate 101 includes the photoelectric conversion portion 102, an element isolation region 103, and a source region and drain region (not shown) of a transistor. The photoelectric conversion portion 102 is made of a photoelectric conversion element such as a photodiode. A gate 105 of the transistor is formed on the semiconductor substrate 101. In this embodiment, one pixel is defined by one photoelectric conversion portion 102 and a transistor configured to read out charges from the photoelectric conversion portion 102.

An insulating layer 104 covers the upper surface of the semiconductor substrate 101 and the gate 105. A wiring pattern 107 is formed on the insulating layer 104. Wiring patterns 108 and 109 are formed above the wiring pattern 107 to be spaced apart from each other. An insulating layer 106 is formed on the insulating layer 104. These wiring patterns 107 to 109 are insulated from each other by the insulating layer 106. The semiconductor substrate 101 and the wiring pattern 107 are insulated from each other by the insulating layer 104. Therefore, in a description below, the insulating layers 104 and 106 will collectively be referred to as an interlayer insulating layer. The wiring patterns, or each wiring pattern and an impurity region or the electrode of the semiconductor substrate 101 are connected to each other by a contact plug 114 extending through the insulating layers 104 and 106.

The light waveguide 110 is formed on the photoelectric conversion portion 102. The light waveguide 110 is provided for each pixel. That is, the solid-state image sensor 100 includes one light waveguide 110 for one photoelectric conversion portion 102. The side surfaces of the light waveguide 110 are surrounded by the interlayer insulating layer. The upper surface of the light waveguide 110 is flush with the upper surface of the interlayer insulating layer (that is, the upper surface of the insulating layer 106). The lower surface of the light waveguide 110 is flush with the lower surface of the interlayer insulating layer (that is, the lower surface of the insulating layer 104). Instead of this, at least one of the upper surface or the lower surface of the light waveguide 110 may be positioned between the upper surface and the lower surface of the interlayer insulating layer.

The light waveguide 110 has a refractive index higher than that of the interlayer insulating layer. For example, the light waveguide 110 may be formed by silicon nitride having a refractive index of 1.8, and the interlayer insulating layer may be formed by silicon oxide having a refractive index of 1.46. Therefore, light entering the light waveguide 110 outside the solid-state image sensor 100 is reflected by the interface between the light waveguide 110 and the interlayer insulating layer, and guided to the photoelectric conversion portion 102. The shape of the upper surface 110a of the light waveguide 110 will be described later. A wiring pattern 111, a passivation layer 112, and an electrode pad 113 are formed on the interlayer insulating layer.

Figure 2A:
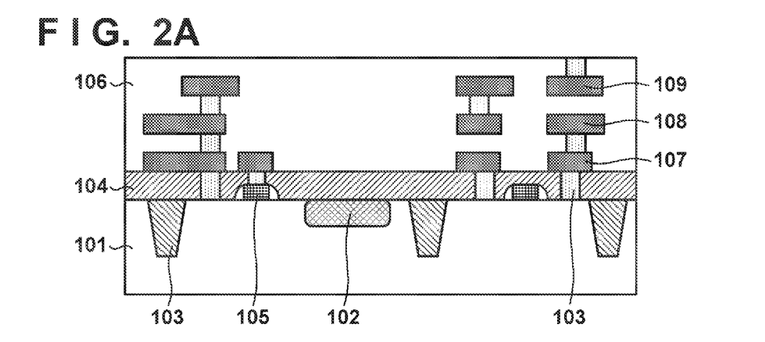
FIGS. 2A to 2C are views for explaining a method of manufacturing the solid-state image sensor.

A method of manufacturing the solid-state image sensor 100 will now be described with reference to FIGS. 2A to 2C, and FIGS. 3A and 3B. First, as shown in FIG. 2A, the semiconductor substrate 101 is prepared in which the photoelectric conversion portion 102, another impurity region, and the element isolation region 103 are formed. Then, the gate 105, the interlayer insulating layer (that is, the insulating layer 104 and the insulating layer 106), the wiring patterns 107 to 109, and the contact plug 114 are formed on this semiconductor substrate 101. The interlayer insulating layer is formed by, for example, silicon oxide (SiO). This step may be performed by using an existing technique, and thus a detailed description thereof will be omitted.

Figure 2B:
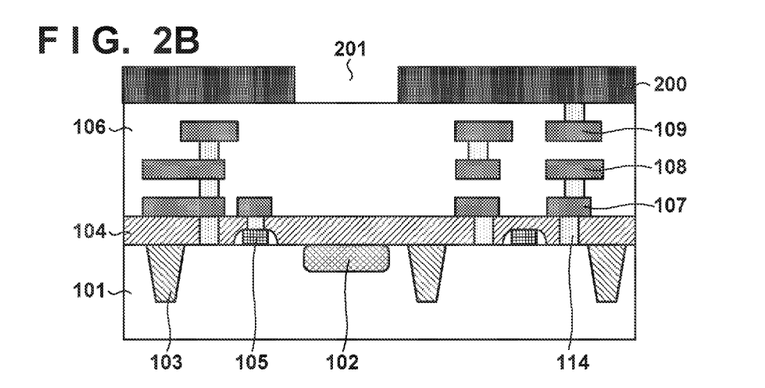

Then, as shown in FIG. 2B, a resist pattern 200 is formed on the insulating layer 106. The resist pattern 200 has an opening 201 above the photoelectric conversion portion 102. The lower end of the opening 201 has a shape corresponding to that of the upper surface of the light waveguide 110 described above. The resist pattern 200 is formed by, for example, applying a resist onto the insulating layer 106, and performing exposure and development of this resist.

Figure 2C:
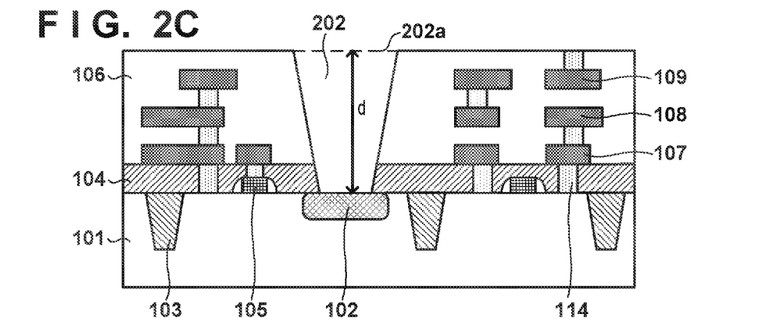

Then, as shown in FIG. 2C, an opening 202 is formed in the interlayer insulating layer by dry etching the interlayer insulating layer through the opening 201 of the resist pattern 200, and then the resist pattern 200 is removed. A depth d of the opening 202 is, for example, 1.5 µm, and an inclined angle of each side wall of the opening 202 is, for example, 80° to 90°. When the inclined angle of each side wall of the opening 202 is 90°, the width of the opening 202 is constant regardless of the depth of the opening 202. When the inclined angle of each side wall of the opening 202 is less than 90°, the opening 202 has a tapered shape with a narrower width at a deeper position. The inclined angle of each side wall of the opening 202 is not constant but may change depending on the depth. A practical range of the depth d may be, for example, from 0.5 to 5.0 µm. In this embodiment, the range may be from 1.0 to 3.0 µm, and more specifically, from 1.0 to 2.0 µm. The shape of an upper end 202a of the opening 202 will be described later.

Figure 3A:
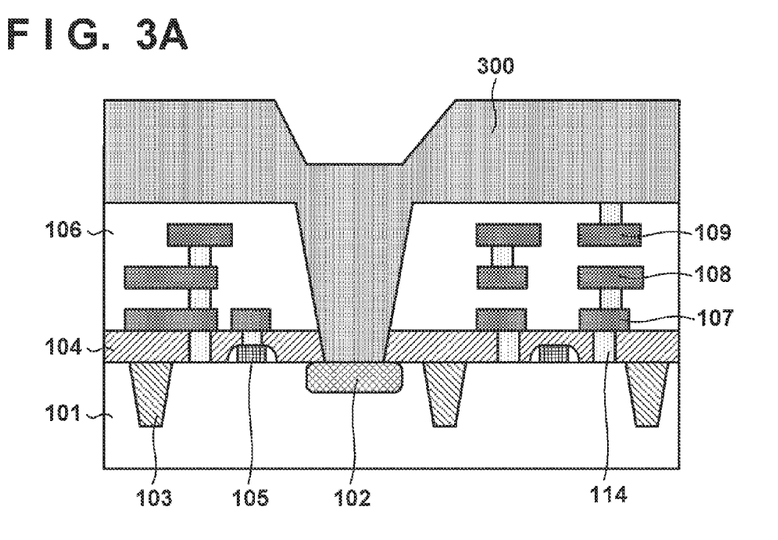
FIGS. 3A and 3B are views for explaining the method of manufacturing the solid-state image sensor.

Then, as shown in FIG. 3A, an embedded member 300 is formed on the interlayer insulating layer by using a CVD (chemical vapor deposition) method. A part of the embedded member 300 is embedded inside the opening 202. The member embedded inside the opening 202 is a light-transmitting material and may be, for example, silicon oxide, a resin, or the like. In order to form the light waveguide 110, a member made of a material having the refractive index higher than that of the interlayer insulating layer, for example, silicon nitride (SiN) or silicon oxynitride (SiON) may be used as the embedded member 300. The embedded member 300 can be formed by using the CVD method. In particular, the embedded member 300 may be formed by using a high density plasma (HDP) CVD method. In the high density plasma CVD method, gas such as $SiH_4$, $N_2$, $NH_3$, Ar, or He is used in an apparatus in which plasma discharge is performed in an ICP (Inductively Coupled Plasma) method. A chamber pressure is controlled to about 1 to 10 mTorr. The semiconductor substrate 101 is electrostatically fixed by ESC (Electrostatic chuck), a bias power of 13.56 MHz is applied, and the embedded member 300 is formed.

Figure 3B:
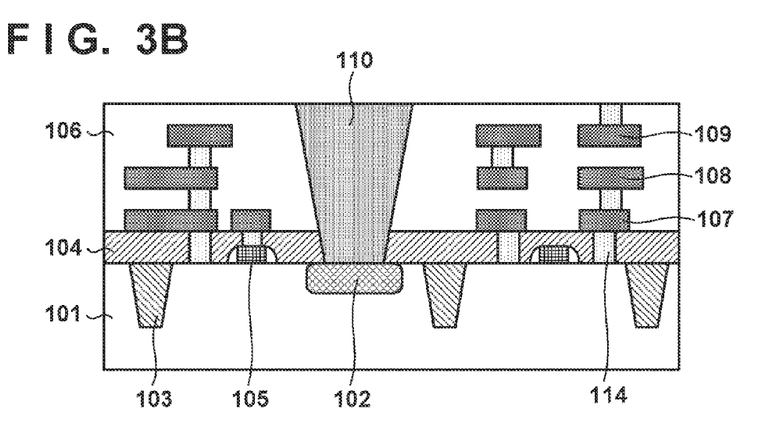

Then, as shown in FIG. 3B, the upper surface of the embedded member 300 is planarized by using a method such as CMP. This planarization is performed until the upper surface of the interlayer insulating layer is exposed. As a result, a portion of the embedded member 300 embedded in the opening 202 remains. This remaining portion becomes the light waveguide 110. Then, the solid-state image sensor 100 of FIG. 1A is formed by forming the wiring pattern 111, the passivation layer 112, and the electrode pad 113 on the interlayer insulating layer.

Figure 8:
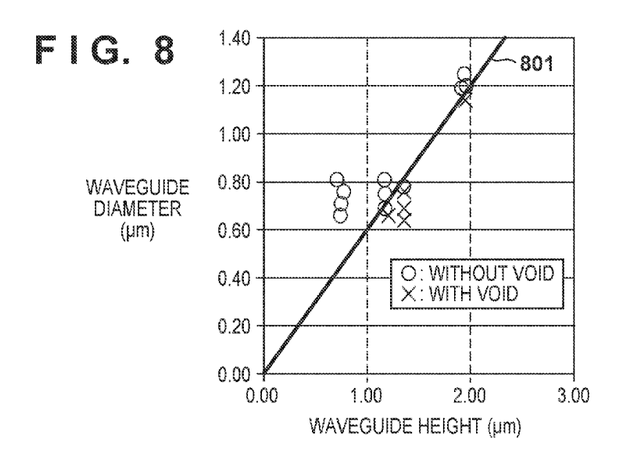
FIG. 8 is a graph for explaining the presence/absence of formation of the voids depending on the size of a light waveguide.

The shape of the upper surface 110a of the light waveguide 110 described above will now be described. First, the principle of the present invention will be described with reference to FIG. 8. FIG. 8 is a graph showing an experimental result of whether a void is formed when a light waveguide having a circular upper surface is formed with respect to various sizes (heights and diameters). In FIG. 8, the abscissa represents the height (µm) of the light waveguide, and the ordinate represents the diameter (µm) of the upper surface (circular shape) of the light waveguide. In FIG. 8, each ○ mark indicates the size of the light waveguide without any void, and each x mark indicates the size of the light waveguide with a void. It can be read that no void is formed in a sample above a straight line 801 of FIG. 8. That is, letting h be a height of the light waveguide, the void is unlikely to be formed in forming the waveguide if the diameter of the upper surface of the light waveguide is 0.6h or more.

A condition on which a void is unlikely to be formed in forming a light waveguide whose upper surface has a shape other than a circle will now be considered. Letting h be the height of the light waveguide, it is considered that the void is unlikely to be formed in forming the light waveguide if the upper surface of the light waveguide has a shape based on a circle having a diameter of 0.6h or more. Note that the shape based on the circle having the diameter of 0.6h or more includes (1) a locus obtained by moving this circle, (2) a shape obtained by partially superimposing these circles on each other, and (3) a combination of these. A circle having a diameter larger than 0.6h can be represented by the locus obtained by moving a circle of 0.6h in diameter. Therefore, the shape based on the circle having the diameter of 0.6h or more can be represented as a shape based on the circle of 0.6h in diameter. When the upper surface of the light waveguide has the shape based on the circle of 0.6h in diameter, it is possible to draw, at each point on the circumference of the upper surface, a circle of 0.6h in diameter which contacts the circumference at the point and does not include a portion outside the upper surface. When the circumference of the upper surface has a convex curve, the fact that the upper surface of the light waveguide has the shape based on the circle having the diameter of 0.6h or more and the fact that a curvature radius at each point on the circumference of the upper surface of the light waveguide is 0.3h or more are equivalent to each other. Note that the convex curve is a curve in a Euclidean plane, and a condition that "all points on the curve exist only on one side of a tangent (including on the tangent)" holds for each point on the curve. A circle having a radius that matches the curvature radius at each point on the circumference of the upper surface of the light waveguide is referred to as a curvature circle. Note that the circumference of the upper surface can include not only a curve portion but also a straight line portion. Since the curvature radius of the straight line portion is infinite, the upper limit on the curvature radius at each point on the circumference of the upper surface of the light waveguide may not specifically be set. An example of such a shape will be described in detail below.

Figure 4:
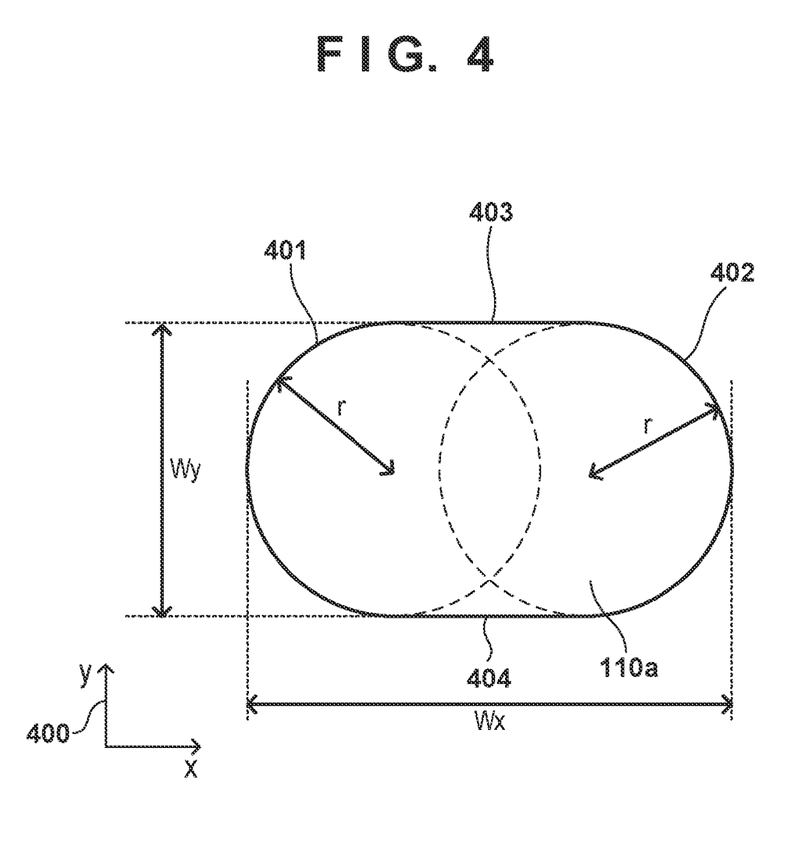
FIG. 4 is a view for explaining the shape of an opening used in the solid-state image sensor.

FIG. 4 is a view in which attention is paid to the upper surface 110a of the light waveguide 110. The circumference of the upper surface 110a is formed by two semicircles 401 and 402 each having a radius r, and two straight line portions 403 and 404 which smoothly connect the end portions of these semicircles 401 and 402 to each other. Such a shape is generally referred to as an oval. The circumference of an oval has a convex curve. Letting h be the height of the light waveguide 110, the upper surface 110a has the shape based on the circle of 0.6h in diameter by setting 2r≥0.6h. In this case, it is possible to draw, at each point on the circumference of the upper surface 110a, the circle of 0.6h in diameter which contacts the circumference at the point and does not include a portion outside the upper surface. A curvature radius at each point on the circumference of the upper surface 110a becomes 0.3h or more. In other words, the minimum value of the curvature radius on the circumference of the upper surface 110a becomes 0.3h. Note that there is a limit to an improvement in light use efficiency even if the light waveguide is made extremely larger, and the extremely large light waveguide may rather decrease a resolution. Therefore, the minimum value of the curvature radius on the circumference of the upper surface 110a of the light waveguide 110 may be 0.6h or less (0.6d or less). That is, the minimum value of the diameter of a curvature circle on the circumference of the upper surface 110a of the light waveguide 110 may be 1.2h or less (1.2d or less). When the height h of the light waveguide 110 is 1.0 µm, the radius r can be 0.3 µm or more and may be, for example, 0.4 µm.

An x-axis and a y-axis are defined as shown in an orthogonal coordinate system 400 of FIG. 4. The x-axis and the y-axis are orthogonal to each other. A direction along the x-axis will be referred to as an x direction, and a direction along the y-axis will be referred to as a y direction. The x-axis and the x direction are parallel to each other, the y-axis and the y direction are parallel to each other, and the x direction and the y direction are orthogonal to each other. The x direction and the y direction are parallel to the upper surface of the semiconductor substrate 101. A z-axis (not shown) is perpendicular to the x-axis and the y-axis, and is perpendicular to the upper surface of the semiconductor substrate 101. Let Wx be a maximum value of the width of the upper surface 110a in the x direction. Let Wy be a maximum value of the width of the upper surface 110a in the y direction. In a description below, the "maximum value of the width" will simply be referred to as a "width". The width Wx is the same as the width, in the x direction, of projection of the upper surface 110a onto a surface perpendicular to the y-axis. The surface perpendicular to the y-axis is parallel to the x-axis. Projection onto the surface perpendicular to the y-axis is typically projection in the y direction, that is, orthogonal projection. The width Wy is the same as the width, in the y direction, of projection of the upper surface 110a onto a surface perpendicular to the x-axis. The surface perpendicular to the x-axis is parallel to the y-axis. Projection onto the surface perpendicular to the x-axis is typically projection in the x direction, that is, orthogonal projection. The upper surface 110a has the shape other than the circle, and thus Wx≠Wy holds. In an example of FIG. 4, Wx may be 1.5 times larger than Wy.

In the above-described manufacturing method, the upper end 202a of the opening 202 and the upper surface 110a of the light waveguide 110 have the shapes almost equal to each other. Therefore, in order for the upper surface 110a of the light waveguide 110 to have the shape as described above, the shape of the upper end 202a of the opening 202 may be the shape based on a circle of 0.6d in diameter (note that d refers to the depth of the opening 202). The above description of the shape of the upper surface 110a of the light waveguide 110 is replaced by a description of the shape of the upper end 202a of the opening 202. That is, the height h of the light waveguide matches the depth d of the opening 202, and it is thus possible to read a value of 0.6h or the like as 0.6d or the like by using the depth d of the opening 202. That is, the upper end 202a of the opening 202 suffices to have a shape capable of drawing, at each point on the circumference of the upper end 202a, the circle of 0.6d in diameter which contacts the circumference at the point and does not include a portion outside the upper surface.

Figure 7A:
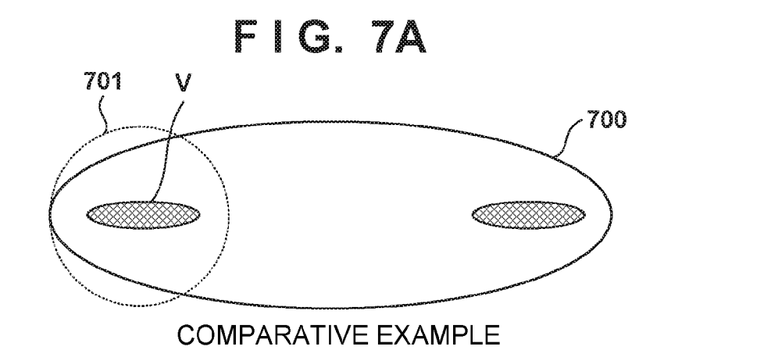
FIGS. 7A to 7C are views for explaining cases in which voids are formed.
Figure 7B:
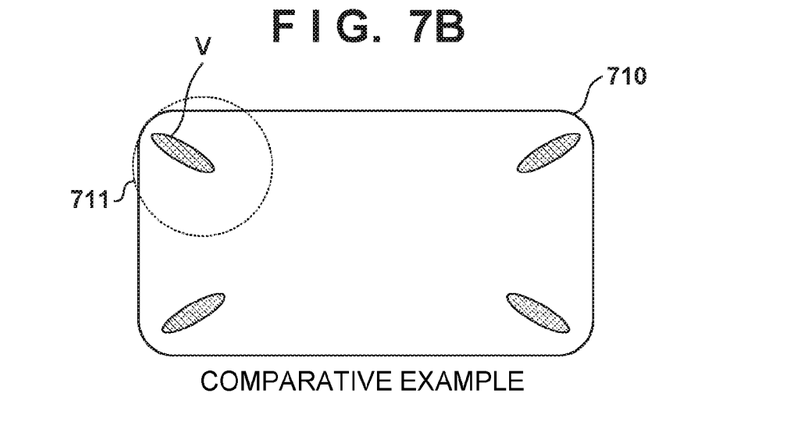
Figure 7C:
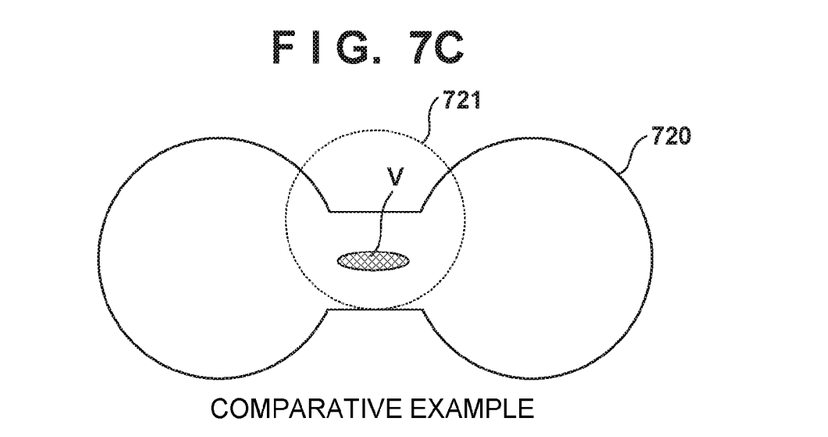

The shape of an upper surface of a light waveguide according to a comparative example will now be shown with reference to each of FIGS. 7A to 7C. None of these upper surfaces has a shape based on a circle of 0.6h in diameter, and thus a void may be formed. FIG. 7A shows a case in which the circumference of an upper surface 700 of the light waveguide has an elliptical shape. The elliptical shape has a convex curve. A circle 701 of 0.6h in diameter contacting a point on an ellipse at which the smallest curvature radius is obtained includes a portion outside the upper surface 700 regardless of how it is drawn. Accordingly, voids V may be formed near the point on the ellipse at which the smallest curvature radius is obtained. The case falls within the scope of this embodiment as long as the minimum value of the curvature radium of the point on the ellipse is changed to 0.3h or more. FIG. 7B shows a case in which the circumference of an upper surface 710 of the light waveguide has a rectangular shape with round corners. The circumference of this shape has a convex curve. A circle 712 of 0.6h in diameter which contacts points near the corners includes a portion outside the upper surface 710 regardless of how it is drawn. Accordingly, the voids V may be formed near the points near the corners. The case falls within the scope of this embodiment as long as the shape of each corner in FIG. 7B is changed to a shape (a quadrilateral having round corners) based on a circle having a diameter of 0.6h or more. FIG. 7C shows a case in which the circumference of an upper surface 720 of a light waveguide has a dumbbell-like shape. The circumference of this shape does not have a convex curve. A circle 721 of 0.6h in diameter which contacts a point on a straight line portion includes a portion outside the upper surface 720 regardless of how it is drawn. Accordingly, the void V may be formed near the straight line portion. The case falls within the scope of this embodiment as long as the thickness of the straight line portion is changed to 0.6h or more in diameter.

As described above, it is possible to suppress formation of the voids in formation of the light waveguide 110 as long as the light waveguide 110 has the shape as in this embodiment. As a result, it is possible to suppress a loss in the amount of light guided to the photoelectric conversion portion 102.

Figure 5A:
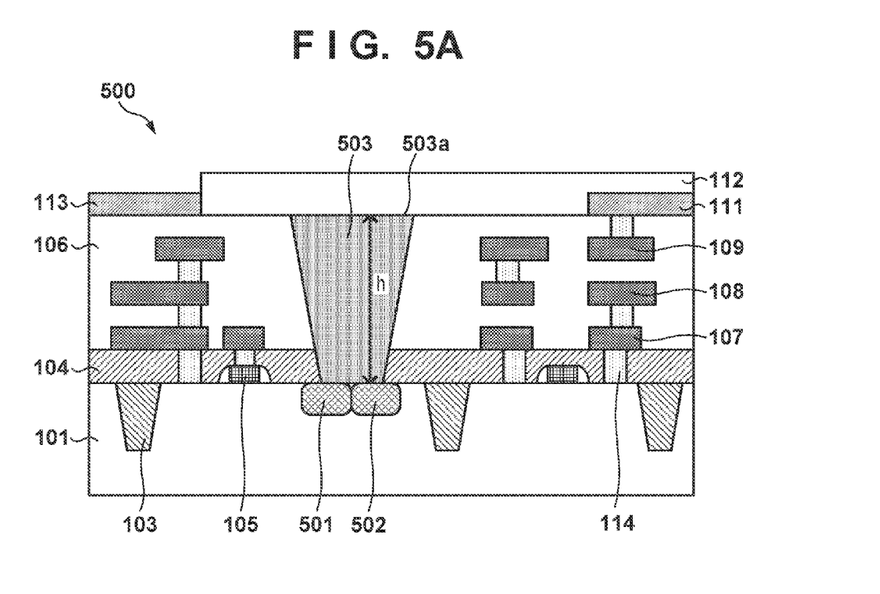
FIGS. 5A and 5B are views for explaining the structure of a solid-state image sensor.
Figure 5B:
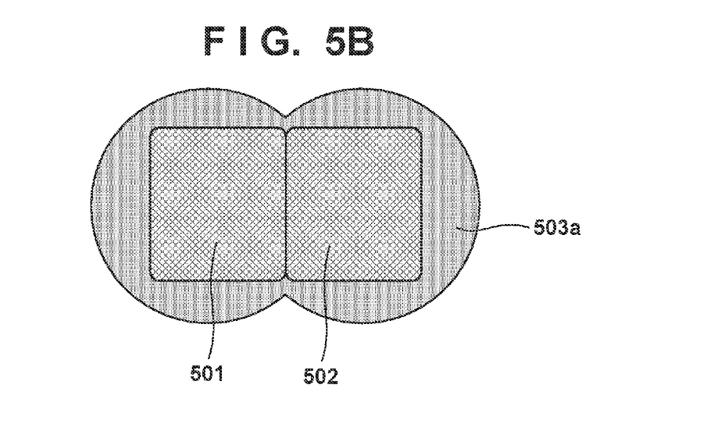

The structure of a solid-state image sensor 500 according to some embodiments of the present invention will be described with reference to FIGS. 5A and 5B. The solid-state image sensor 500 includes a plurality of pixels arranged in a two-dimensional array. FIG. 5A is a sectional view showing the solid-state image sensor 500 in which attention is paid to one pixel. FIG. 5B is a plan view showing the solid-state image sensor 500 in which attention is paid to photoelectric conversion portions 501 and 502, and an upper surface 503a of a light waveguide 503. The solid-state image sensor 500 is different from a solid-state image sensor 100 in that the former includes the photoelectric conversion portions 501 and 502 in place of a photoelectric conversion portion 102, and includes the light waveguide 503 in place of a light waveguide 110. The solid-state image sensor 500 may be the same as the solid-state image sensor 100 in other respects. The light waveguide 503 is different from the light waveguide 110 only in shape, and may be the same as the light waveguide 110 in terms of other respects such as a material and a position. A method of manufacturing the solid-state image sensor 500 is the same as that of the solid-state image sensor 100, and thus a repetitive description thereof will be omitted.

Each of the photoelectric conversion portions 501 and 502 is made of a photoelectric conversion element such as a photodiode. In this embodiment, one pixel is defined by two photoelectric conversion portions 501 and 502, and a transistor configured to read out charges from the photoelectric conversion portions 501 and 502. Focus detection (i.e. focusing) may be performed by using a signal read out from each of two photoelectric conversion portions 501 and 502 included in one pixel. Further, one pixel may include two or more photoelectric conversion portions.

Figure 6:
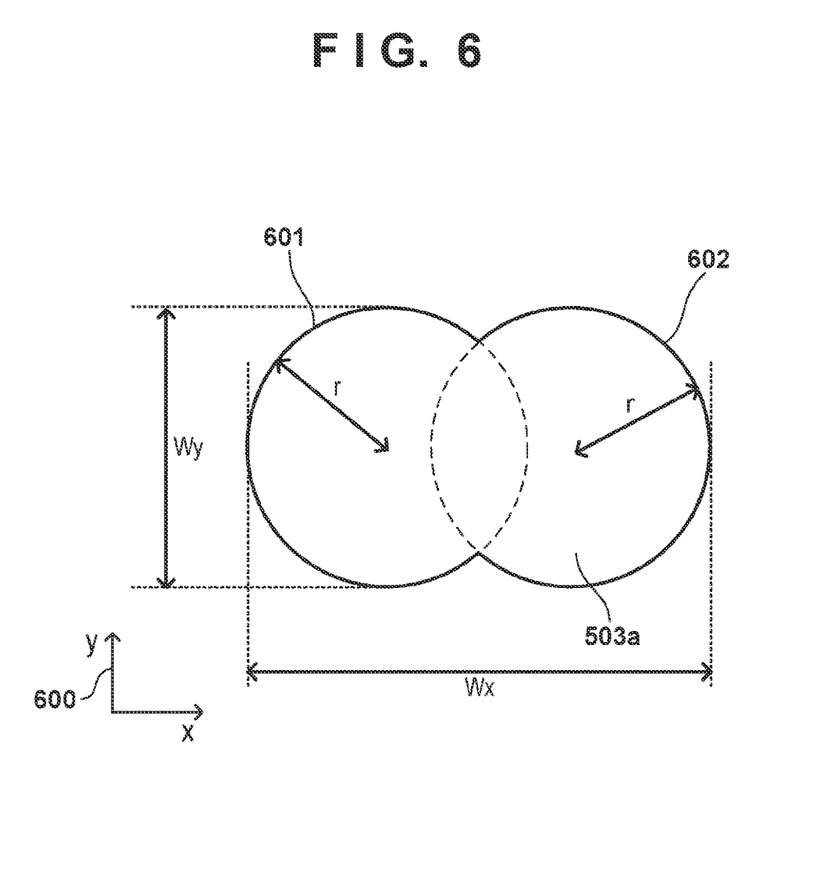
FIG. 6 is a view for explaining the shape of the opening used in the solid-state image sensor.

The light waveguide 503 is formed on two photoelectric conversion portions 501 and 502 adjacent to each other. FIG. 6 is a view in which attention is paid to an upper surface 503a of the light waveguide 503. The circumference of the upper surface 503a is obtained by connecting the end portions of two circular arcs 601 and 602 each having a radius r. Note that each of the circular arcs 601 and 602 is longer than a semicircle. In other words, the upper surface 503a has a shape obtained by partially superimposing two circles on each other. Letting h be a height of the light waveguide 503, the upper surface 503a has a shape based on a circle of 0.6h in diameter by setting 2r≥0.6h. In this case, it is possible to draw, at each point on the circumference of the upper surface 503a, the circle of 0.6h in diameter which contacts the circumference at the point and does not include a portion outside the upper surface. When the height h of the light waveguide 503 is 1.24 µm, the radius r can be 0.372 µm or more and may be, for example, 0.4 µm.

An x-axis and a y-axis are defined as shown in an orthogonal coordinate system 600 of FIG. 6. Let Wx be a maximum value of the width of the upper surface 503a in a direction parallel to the x-axis. Let Wy be a maximum value of the width of the upper surface 503a in a direction parallel to the y-axis. The upper surface 503a has a shape other than the circle, and thus Wx≠Wy holds. In an example of FIG. 6, Wx>1.5Wy may hold.

Figure 9:
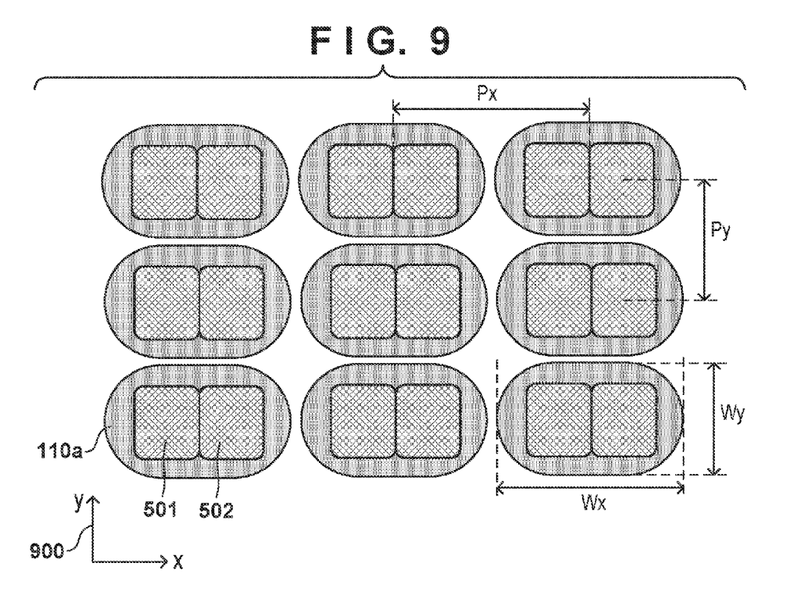
FIG. 9 is a view for explaining the positional relationships between pixels and light waveguides of the solid-state image sensor.

The solid-state image sensor 500 may include the light waveguide 110 in place of the light waveguide 503. In addition, the solid-state image sensor 100 may include the light waveguide 503 in place of the light waveguide 110. The arrangement of pixels in the solid-state image sensor 500 will now be described with reference to FIG. 9. In this example, the solid-state image sensor 500 includes the light waveguide 110 in place of the light waveguide 503. As described above, each pixel includes two photoelectric conversion portions 501 and 502. The x-axis and the y-axis are defined as shown in an orthogonal coordinate system 900 of FIG. 9. Two photoelectric conversion portions 501 and 502 are arrayed in the direction parallel to the x-axis. The plurality of pixels are arranged in a matrix such that a pitch Px in the direction parallel to the x-axis becomes larger than a pitch Py in the direction parallel to the y-axis. Each light waveguide 110 is arranged such that the upper surface 110a becomes long in the horizontal direction. That is, the light waveguide 110 is arranged such that the maximum value Wx of the width of the upper surface 503a in the direction parallel to the x-axis becomes larger than the maximum value Wy of the width of the upper surface 503a in the direction parallel to the y-axis. By arranging the photoelectric conversion portions 501 and 502, and the light waveguide 110 as described above, it is possible to increase the area of a portion of a semiconductor substrate 101 covered with the upper surface 110a of the light waveguide 110.

Figure 10:
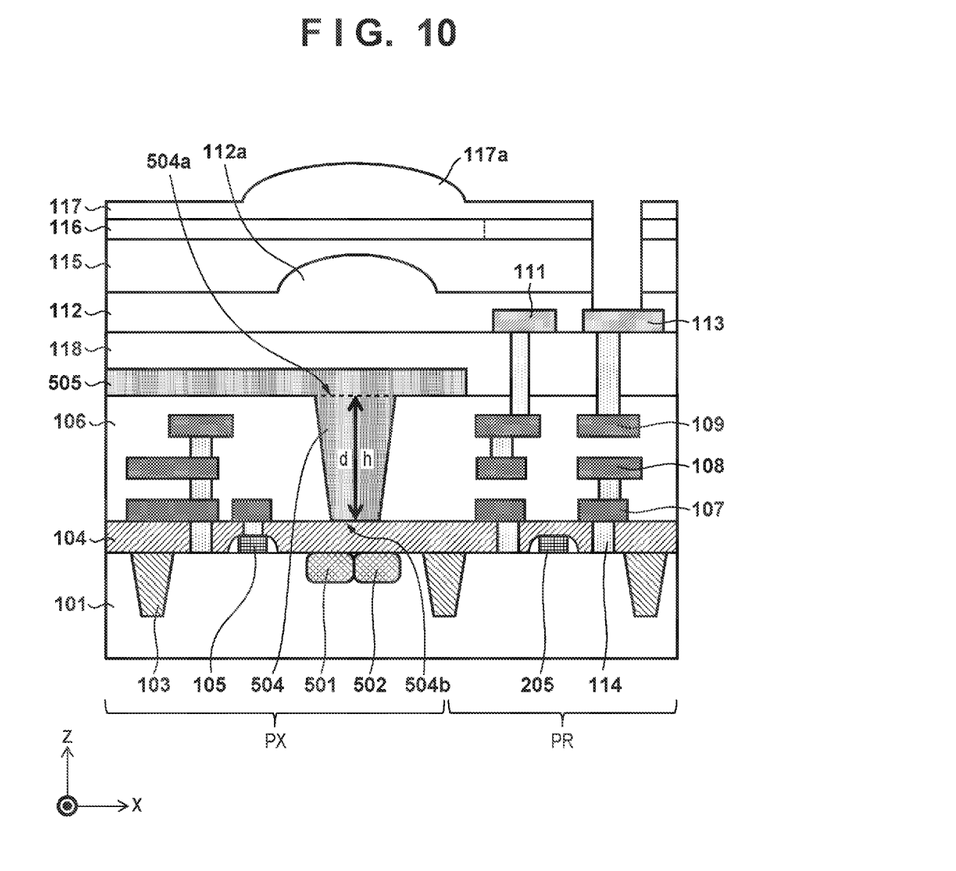
FIG. 10 is a view for explaining the structure of a solid-state image sensor according to another embodiment.
Figure 11A:
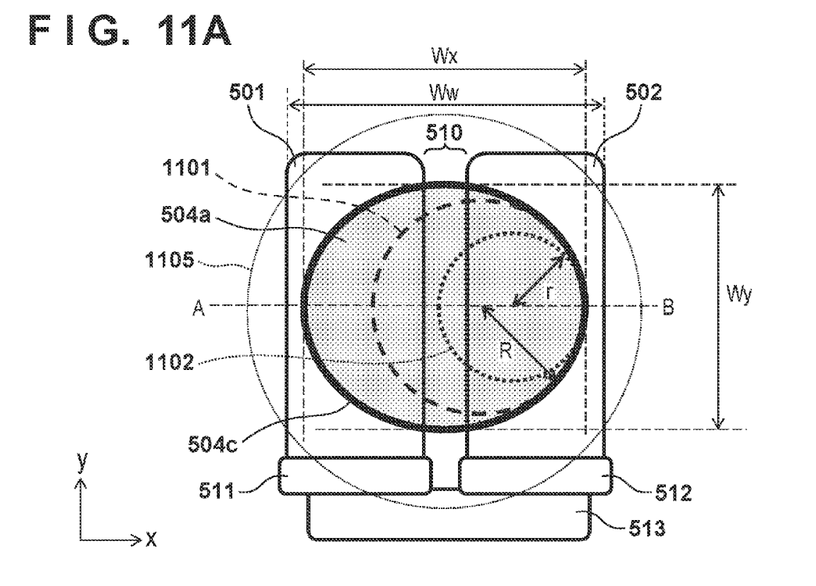
FIGS. 11A and 11B are views for each explaining the shape of an opening used in the solid-state image sensor.
Figure 11B:
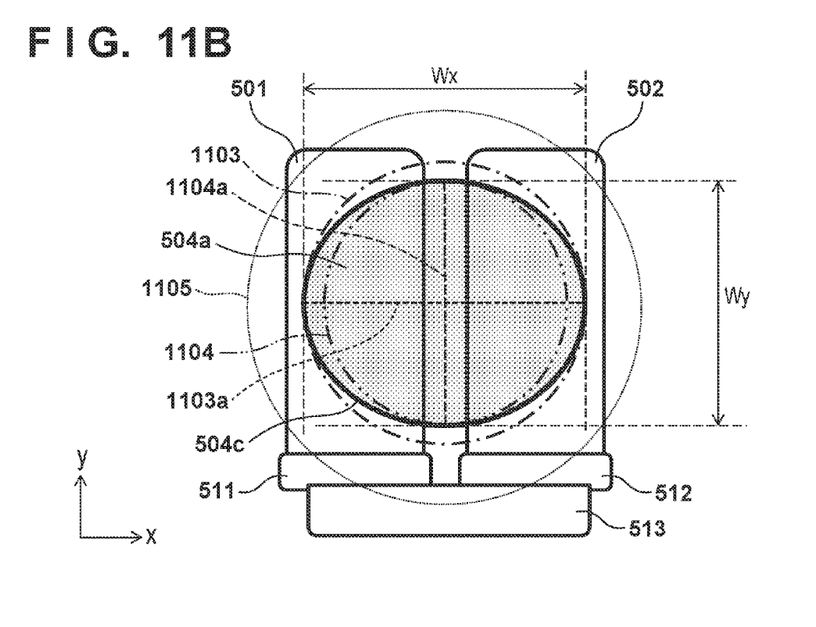

The structure of a solid-state image sensor 1000 according to some embodiments of the present invention will be described with reference to FIGS. 10, 11A, and 11B. The solid-state image sensor 1000 is different from a solid-state image sensor 500 in that the former includes a light waveguide 504 in place of a light waveguide 503. The solid-state image sensor 1000 may be the same as the solid-state image sensor 500 except for respects to be described below. FIG. 10 is a sectional view showing the solid-state image sensor 1000 in which attention is paid to one pixel. FIGS. 11A and 11B are plan views each showing the solid-state image sensor 1000 in which attention is paid to photoelectric conversion portions 501 and 502, and an upper surface 504a of the light waveguide 504. Note that matters to be described below are also applicable to a solid-state image sensor 100 and the solid-state image sensor 500.

As shown in FIG. 10, a light-transmitting film 505 made of substantially the same material as the light waveguide 504 covers the upper surface 504a of the light waveguide 504 and the upper surface of an insulating layer 106. For example, when the light waveguide 504 is made of silicon nitride, the light-transmitting film 505 is a silicon nitride film. Since the light waveguide 504 and the light-transmitting film 505 are made of the same material, it is impossible to observe the upper surface 504a as a distinct interface. The upper surface 504a of the light waveguide 504 corresponds to a surface obtained by virtually extending the upper surface of the insulating layer 106 and corresponds to a range surrounded by the side surfaces of an opening 202. Such a structure is obtained by, in a step of FIG. 3B, terminating polishing of an embedded member 300 before the upper surface of an interlayer insulating layer is exposed. In this case, a part of the embedded member 300 remains on the interlayer insulating layer, and the part of the embedded member 300 remaining on the interlayer insulating layer becomes the light waveguide 504. The part of the embedded member 300 outside the opening 202 and remaining on the interlayer insulating layer is not surrounded by the interlayer insulating film, and thus does not substantially function as the light waveguide 504. Therefore, the light waveguide 504 can be considered to be formed only in the opening 202. Accordingly, a height (length) h of the light waveguide 504 matches a depth d of the opening 202.

The light-transmitting film 505 is arranged in a pixel circuit portion PX, and is not arranged in at least a portion of a peripheral circuit portion PR in which a transistor 205, a wiring pattern 111, and an electrode pad 113 are arranged. However, the light-transmitting film 505 can also be arranged in the peripheral circuit portion PR.

The light waveguide 504 is spaced apart from the semiconductor substrate 101. An insulating layer 104 is positioned between the light waveguide 504, and the photoelectric conversion portions 501 and 502. An interface between the light waveguide 504 and the insulating layer 104 becomes a lower surface 504b of the light waveguide 504. The height (length) h of the light waveguide 504 matches a distance between the upper surface 504a of the light waveguide 504 and the lower surface 504b of the light waveguide 504. The height h of the light waveguide 504 and the depth d of the opening 202 also match each other. In this example, in steps corresponding to those in FIGS. 2B and 2C, the insulating layer 104 is used as an etching stopper when the opening 202 is formed by etching the insulating layer 106. Note that the insulating layer used as the etching stopper may be the same layer as an etching stopper used when a contact hole for a contact plug 114 is formed or may be the same as an etching stopper used when a trench for a wiring pattern 107 having a damascene structure is formed. An etching stopper for the opening 202 may be the same layer as an anti-diffusion layer of copper contained in the wiring pattern 107.

As in the above-described solid-state image sensors, in the solid-state image sensor 1000, the shape of the upper surface 504a can draw a circle of 0.6d (0.6h) in diameter. As shown in FIG. 11A, a circumference 504c of the upper surface 504a has an elliptical shape. A width Wx of the upper surface 504a corresponds to the major axis of an ellipse, and a width Wy of the upper surface 504a corresponds to the minor axis of the ellipse (Wx>Wy). If the ellipse has a major-axis length 2a (major radios 2a) and a minor-axis length 2b (minor radios 2b) (b<a), a=Wx/2 and b=Wy/2 hold.

In FIG. 11A, a minimum value R of the curvature radius of the circumference 504c is indicated by a curvature circle 1101 having the radius R. The curvature circle 1101 is inscribed in the circumference 504c at an intersection point between the major axis and the circumference 504c. FIG. 11A also shows an inscribed circle 1102 (i.e. incircle) having a radius r which is inscribed in the circumference 504c at the intersection point between the major axis and the circumference 504c. Note that r=0.3d=0.3h holds. FIG. 11A shows that the curvature circle 1101 is larger than the inscribed circle 1102 (R>r), and a relationship among the minimum value R of the curvature radius, the depth d, and the height h satisfies R r=0.3d=0.3h.

Considering the above relationship geometrically, the curvature radius of the ellipse with the major-axis length 2a (major radios 2a) and the minor-axis length 2b (minor radios 2b) has a maximum value of $a^2/b$ and a minimum value of $b^2/a$ (b<a). In this embodiment, the minimum value of the curvature radius of the circumference 504c of the upper surface 504a of the light waveguide 504 suffices to be 0.3d or more (0.3h or more). That is, it is only necessary to satisfy $Wy^2/2Wx \geq 0.3d$, and in other words, $Wy^2/Wx \geq 0.6d$. In order to suppress a decrease in a resolution, $Wy^2/2Wx \leq 0.6d$, ($Wy^2/Wx \leq 1.2d$) may be set. The light waveguide having the extremely long narrow upper surface 504a reduces incident angle dependence of sensitivity. Therefore, the ratio of the width Wx in the x direction to the width Wy in the y direction may not be made so high. For example, the ratio may be 1.0<Wx/Wy≤1.5 or can also be 1.10<Wx/Wy<1.30. Note that as for 1.0<Wx/Wy, it can also be considered that there is no significant difference between the width Wx and the width Wy if a difference between the width Wx and the width Wy is less than 1%. Strictly speaking, therefore, it can be written as 1.01≤Wx/Wy.

It is possible to approximately apply $Wy^2/Wx \geq 0.6d$ as a condition of the width based on the ellipse even if the circumference 504c of the upper surface 504a of the light waveguide has a shape other than the ellipse. An approximation is particularly appropriate if the circumference 504c of the upper surface 504a of the light waveguide has a convex curve over an entire circumference. An example in which the approximation is appropriate for the shape other than the ellipse will be described with reference to FIG. 11B. FIG. 11B shows the upper surface 504a and its circumference 504c each having the same shape as in FIG. 11A. A large circle 1103 is defined which sets, as a diameter, a line segment 1103a with the upper surface 504a having a length equal to the maximum width (width Wx) in the x direction. In FIG. 11B, the large circle 1103 is indicated by an alternate long and short dashed line. This large circle 1103 circumscribes the circumference 504c and sets the major axis of an ellipse as the diameter if the upper surface 504a has an elliptical shape. The large circle 1103 can be a circumscribed circle (i.e. circumcircle) having the minimum diameter which circumscribes the circumference 504c. A small circle 1104 is defined which sets, as a diameter, a line segment 1104a with the upper surface 504a having a length equal to the maximum width (width Wy) in the y direction. In FIG. 11B, the small circle 1104 is indicated by a chain double-dashed line. This small circle 1104 is inscribed in the circumference 504c and sets the minor axis of an ellipse as the diameter if the upper surface 504a has an elliptical shape. The small circle 1104 can be an inscribed circle having the maximum diameter which is inscribed in the circumference 504c. It is appropriate to approximate the circumference 504c to the ellipse if each point on the circumference 504c is positioned in a range from the large circle 1103 to the small circle 1104, that is, any one of a position on the large circle 1103, on the small circle 1104, and between the large circle 1103 and the small circle 1104. If the circumference 504c includes a portion positioned outside the large circle 1103 and a portion positioned inside the small circle 1104, voids are likely to be formed near these portions. Therefore, the shapes of the upper surface 504a and the circumference 504c are preferably designed based on the depth d so as to satisfy a relation of $Wy^2/Wx \geq 0.6d$.

The structures shown in FIGS. 10 and 11A will further be described. Two or more photoelectric conversion portions 501 and 502 included in one pixel are isolated from each other by an isolation portion 510 due to pn-junction isolation, insulator isolation, or the like such that they can read out charges separately from each other. The charges generated in the photoelectric conversion portion 501 are transferred to a detection unit 513 via a transfer unit 511. The charges generated in the photoelectric conversion portion 502 are transferred to the detection unit 513 via a transfer unit 512. The transfer units 511 and 512 are MIS (MOS) gates, and the detection unit 513 is a floating diffusion.

An insulating layer 118 is arranged on the light-transmitting film 505. The insulating layer 118 also extends to the peripheral circuit portion PR. In the peripheral circuit portion PR, a via plug which connects a wiring pattern 109 and the wiring pattern 111 or a via plug which connects the wiring pattern 109 and the electrode pad 113 is provided to extend through the insulating layer 118. A passivation layer 112 in this example includes a lens portion 112a positioned above the photoelectric conversion portions 501 and 502. The lens portion 112a functions as a so-called intralayer lens. A planarizing layer 115, a color filter 116, and a light-transmitting layer 117 are provided in this order on the passivation layer 112. The light-transmitting layer 117 includes a lens portion 117a which functions as a so-called top lens. The insulating layer 118 is a silicon oxide layer. The passivation layer 112 is a silicon nitride layer. Each of the planarizing layer 115, the color filter 116, and the light-transmitting layer 117 is a resin layer. By providing the lens portion 112a as the intralayer lens as described above, it is possible to condense light to the fine light waveguide 504 appropriately.

A dotted circle 1105 shown in FIG. 11A schematically shows a light beam condensed by the lens portion 112a and the lens portion 117a. Light received by the plurality of photoelectric conversion portions 501 and 502 is condensed by the common lens portions 112a and 117a. It is therefore possible to form one pixel by the plurality of photoelectric conversion portions 501 and 502. Such formation is advantageous in performing focus detection for autofocus of a phase difference detection method on an imaging plane.

As shown in FIG. 11A, the plurality of photoelectric conversion portions 501 and 502 are arrayed in the x direction, and the width Wx of the circumference 504c in the x direction is also larger than the width Wy of the circumference 504c in the y direction. As described above, light entering the light waveguide 504 is appropriately distributed to the plurality of photoelectric conversion portions 501 and 502 by making a direction in which the width of the circumference 504c is larger be a direction in which the plurality of photoelectric conversion portions 501 and 502 are arrayed, improving focus detection accuracy. In this example, a distance Ww corresponding to a width obtained by combining the isolation portion 510 and the plurality of photoelectric conversion portions 501 and 502 is larger than the width Wx (Wx<Ww). The distance Ww refers to a distance from the end of the photoelectric conversion portion 501 on the opposite side to the side of the photoelectric conversion portion 502 to the end of the photoelectric conversion portion 502 on the opposite side to the side of the photoelectric conversion portion 501. Even for the opening 202 with the width Wx becoming smaller than the distance Ww, it is possible to suppress formation of the voids and improve performance of the light waveguide 504 by causing the shape of an upper surface 202a of the opening 202 to satisfy the various relations described above. Even for the opening 202 with the width Wx being smaller than the distance Ww and further the width Wy being smaller than the width Wx, it is possible to cause light to enter the light waveguide 504 by using both the lens portion 117a and the lens portion 112a.

All the upper surfaces of the light waveguides described above have shapes with point symmetry and line symmetry. However, the upper surface of a light waveguide in another embodiment may have point symmetry and line symmetry, may have point asymmetry and line symmetry, or may have point asymmetry and line asymmetry. The upper surface of a light waveguide may have a shape obtained by partially superimposing a plurality of (three or more) circles on each other. The center of the upper surface of the light waveguide and the center of the photoelectric conversion portion may be at the same position or may be at different positions when viewed from a direction orthogonal to the upper surface of the semiconductor substrate 101.

As an application of the solid-state image sensor according to each embodiment described above, a camera in which this solid-state image sensor is assembled will exemplarily be described below. The concept of the camera includes not only an apparatus mainly aiming at shooting but also an apparatus (for example, a personal computer, a portable terminal, an automobile, or the like) accessorily having a shooting function. The camera may be a module part such as a camera head. The camera includes the solid-state image sensor according to the present invention exemplified as each embodiment described above, and a signal processing unit which processes a signal output from this solid-state image sensor. This signal processing unit can include, for example, a processor which processes digital data based on a signal obtained from the solid-state image sensor. An A/D converter configured to generate this digital data may be provided on the semiconductor substrate of the solid-state image sensor or on another semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-194397, filed Sep. 30, 2015, which is hereby incorporated by reference herein in its entirety.

What is claimed is:

1. A solid-state image sensor comprising:
   a substrate including a photoelectric conversion portion;
   an insulating layer on a surface of the substrate and having an opening positioned above the photoelectric conversion portion; and
   a member arranged inside the opening,
   wherein letting d be a depth of the opening, the opening has, at an upper end of the opening, a shape having a width in a first direction parallel to the surface of the substrate, and a width in a second direction parallel to the surface of the substrate and orthogonal to the first direction, the widths in the first and second directions being different from each other, and
   wherein the shape is such that a circle of 0.6d in diameter inscribes the circumference of the upper end of the opening.

2. The sensor according to claim 1, wherein the width in the first direction is 1.5 times larger than the width in the second direction.

3. The sensor according to claim 1, wherein one opening is arranged on a plurality of the photoelectric conversion portions.

4. The sensor according to claim 3, wherein the plurality of photoelectric conversion portions are arranged in the first direction, and
   the width in the first direction is larger than the width in the second direction.

5. The sensor according to claim 4, further comprising a plurality of pixels each including a plurality of photoelectric conversion portions,
   wherein a pitch of the plurality of pixels in the first direction is larger than a pitch of the plurality of pixels in the second direction.

6. The sensor according to claim 1, wherein the circumference includes a straight line portion.

7. The sensor according to claim 1, wherein the upper end of the opening has a shape obtained by partially superimposing a plurality of circles, each having a diameter of not less than 0.6d, on each other.

8. The sensor according to claim 1, wherein the shape of the upper end of the opening has one of point symmetry and line symmetry.

9. A solid-state image sensor comprising:
a substrate including a photoelectric conversion portion;
an insulating layer on a surface of the substrate and having an opening positioned above the photoelectric conversion portion; and
a member arranged inside the opening,
wherein letting d be a depth of the opening, the opening has, at an upper end of the opening, a shape having a width in a first direction parallel to the surface of the substrate, and a width in a second direction parallel to the surface of the substrate and orthogonal to the first direction, the widths in the first and second directions being different from each other, and
wherein a curvature radius at each point on a circumference of the upper end of the opening is not less than 0.3d.

10. The sensor according to claim 9, wherein a shape of the opening at the upper end is oval.

11. The sensor according to claim 9, wherein a shape of the opening at the upper end is elliptical.

12. The sensor according to claim 9, wherein the circumference has a convex curve.

13. A camera comprising:
the solid-state image sensor according to claim 9; and
a signal processing unit configured to process a signal obtained by the solid-state image sensor.

14. A solid-state image sensor comprising:
a substrate including a photoelectric conversion portion;
an insulating layer on a surface of the substrate and having an opening positioned above the photoelectric conversion portion; and
a member arranged inside the opening,
wherein at the upper end of the opening, a width Wx in a first direction parallel to the surface of the substrate is larger than a width Wy in a second direction parallel to the surface of the substrate and orthogonal to the first direction,
respective points on a circumference of the opening at the upper end are positioned in a range from a first circle to a second circle, a diameter of the first circle being a line segment connecting two points on the circumference and having a length equal to the width Wx, a diameter of the second circle being a line segment connecting two points on the circumference and having a length equal to the width Wy, and
letting d be a depth of the opening, $Wy^2/Wx \geq 0.6d$ is satisfied.

15. The sensor according to claim 14, wherein $Wy^2/Wx \leq 1.2d$ is satisfied.

16. The sensor according to claim 14, wherein $1.10 < Wx/Wy < 1.30$ is satisfied.

17. The sensor according to claim 14, wherein the depth d is from 1.0 to 3.0 μm.

18. The sensor according to claim 14, wherein one opening is arranged on a plurality of the photoelectric conversion portions arranged in the first direction, and
a shape of the opening is elliptical at the upper end.

19. The sensor according to claim 14, wherein a plurality of the photoelectric conversion portions arranged in the first direction includes a first photoelectric conversion portion and a second photoelectric conversion portion, and a distance Ww from an end of the first photoelectric conversion portion on an opposite side to the second photoelectric conversion portion to an end of the second photoelectric conversion portion on an opposite side to the first photoelectric conversion portion is larger than the width Wx.

20. A method of manufacturing a solid-state image sensor, the method comprising:
forming an insulating layer on a substrate including a photoelectric conversion portion;
forming an opening in a portion of the insulating layer above the photoelectric conversion portion; and
forming an embedded member in the opening,
wherein a width of an upper end of the opening in a first direction and a width of the upper end of the opening in a second direction orthogonal to the first direction are different from each other, and
letting d be a depth of the opening, a curvature radius at each point on a circumference of the upper end of the opening is not less than 0.3d.

* * * * *